US008035223B2

(12) United States Patent
Garrou et al.

(10) Patent No.: US 8,035,223 B2
(45) Date of Patent: Oct. 11, 2011

(54) STRUCTURE AND PROCESS FOR ELECTRICAL INTERCONNECT AND THERMAL MANAGEMENT

(75) Inventors: Philip Garrou, Cary, NC (US); Charles Kenneth Williams, Raleigh, NC (US); Christopher A. Bower, Raleigh, NC (US)

(73) Assignee: Research Triangle Institute, Research Triangle Park, NC (US)

( * ) Notice: Subject to any disclaimer, the term of this patent is extended or adjusted under 35 U.S.C. 154(b) by 749 days.

(21) Appl. No.: 11/846,253

(22) Filed: Aug. 28, 2007

(65) Prior Publication Data

US 2009/0057879 A1    Mar. 5, 2009

(51) Int. Cl.
    *H01L 23/34*    (2006.01)
(52) U.S. Cl. .. 257/713; 257/714; 257/777; 257/E23.097
(58) Field of Classification Search .................. 257/276, 257/625, 686, 712, 713, 714, 716, 717, 777, 257/E23.097, E23.098, E23.099, E23.102
    See application file for complete search history.

(56) References Cited

U.S. PATENT DOCUMENTS

| | | | |
|---|---|---|---|
| 5,001,548 A | 3/1991 | Iversen | |
| 5,225,707 A | 7/1993 | Komaru et al. | |
| 5,378,926 A | 1/1995 | Chi et al. | |
| 6,242,778 B1 | 6/2001 | Marmillion et al. | |
| 6,391,673 B1 | 5/2002 | Ha et al. | |
| 6,992,382 B2 | 1/2006 | Chrysler et al. | |
| 2005/0269665 A1* | 12/2005 | Wylie et al. | 257/522 |
| 2007/0063337 A1* | 3/2007 | Schubert et al. | 257/714 |
| 2007/0085198 A1* | 4/2007 | Shi et al. | 257/714 |
| 2007/0126103 A1* | 6/2007 | Shi | 257/686 |

OTHER PUBLICATIONS

Jeffrey A. Davis et al, "Interconnect Limits on Gigascale Integration (GSI) in the 21$^{st}$ Century", Proceedings of the IEEE, vol. 89, No. 3, Mar. 2001, pp. 305-324.
Kaustav Banerjee, et al., "3-D ICs: A Novel Chip Design for Improving Deep-Submicrometer Interconnect Performance and Systems-On-Chip Integration", Proceedings of the IEEE, Vo. 89, No. 5, May 2001, pp. 602-633.

(Continued)

*Primary Examiner* — Minh-Loan T Tran
*Assistant Examiner* — Leslie Pilar Cruz
(74) *Attorney, Agent, or Firm* — Oblon, Spivak, McClelland, Maier & Neustadt, L.L.P.

(57) ABSTRACT

A structure and method for thermal management of integrated circuits. The structure for thermal management of integrated circuits includes first and second substrates bonded together, at least one of the first and second substrates including at least one circuit element, an entrance through-hole having a length extending through a thickness of at least one of the first substrate and the second substrate, an exit through-hole having a length extending through a thickness of at least one of the first substrate and the second substrate, a bonding element forming a seal between the first and second substrates and forming a space between the first and second substrate, and a coolant channel formed in the space between the first and second substrates such that a fluid entering the entrance through-hole transits the coolant channel and the exit through-hole to provide cooling to the circuit element. The method supplies a fluid through the entrance through-hole, flows the fluid through the coolant channel between the first substrate and second substrates, and removes the fluid from the coolant channel through the exit through-hole.

40 Claims, 14 Drawing Sheets

OTHER PUBLICATIONS

Armin Klumpp, et al. "Chip-To-Wafer Stacking Technology for 3D System Integration", 2003 Electronic Components and Technology Conference, pp. 1080-1083.

Jae-Mo Koo, et al., "Integrated Microchannel Cooling for Three-Dimensional Electronic Circuit Architectures", Journal of Heat Transfer, Jan. 2005, vol. 127, pp. 49-58.

Yoshihiro Tomita, et al. "Copper Bump Bonding With Electroless Metal Cap on 3 Dimensional Stacked Struture", 2000 Electronics Packaging Technology Conference, pp. 286-291.

Yoshihiro Tomita, et al., "Cu Bump Interconnections in 20μm Pitch Utilizing Electroless Tin-Cap on 3D Stacked LSI", 2001 Int'l Symposium on Electronic Materials and Packaging, pp. 107-114.

* cited by examiner

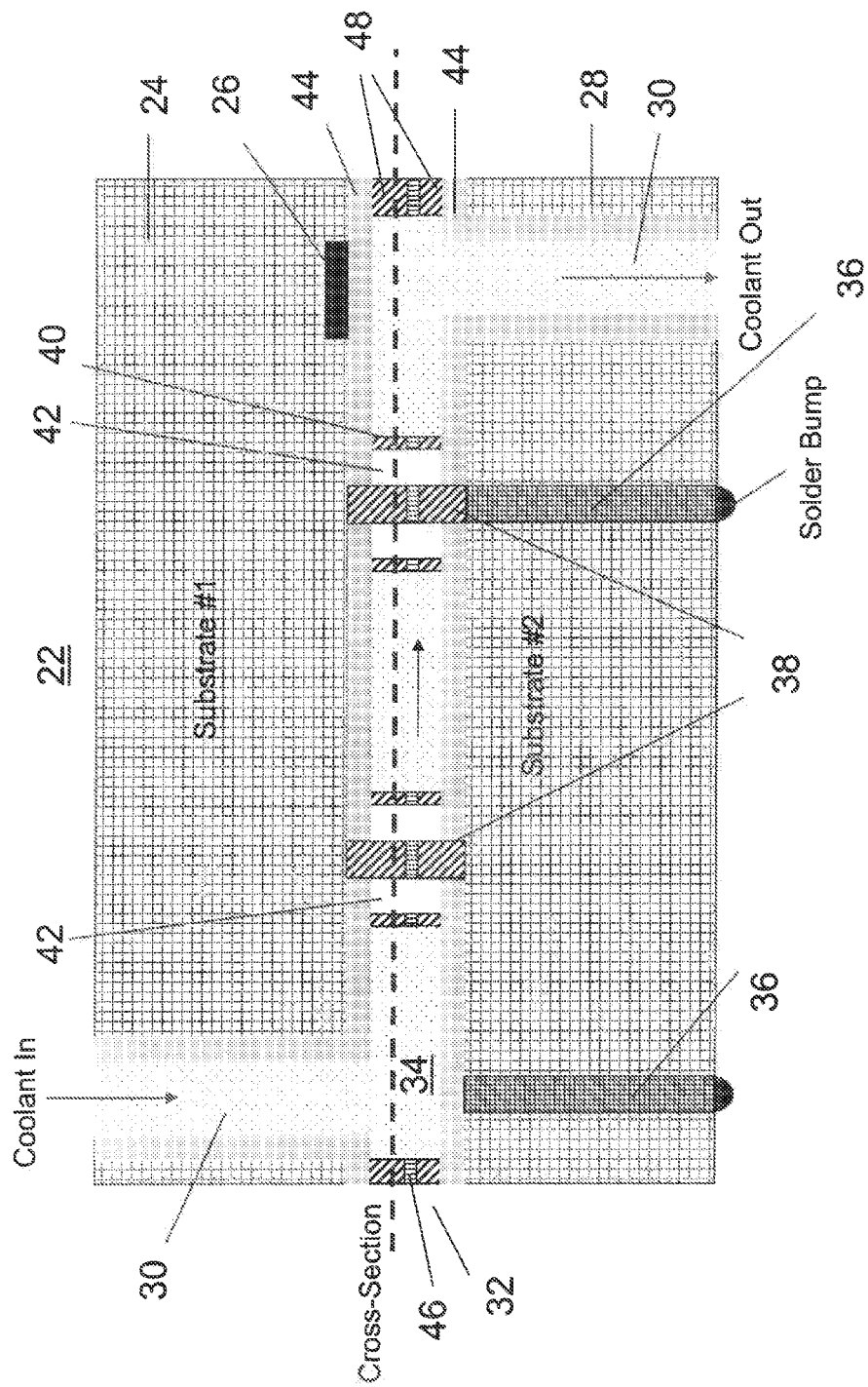

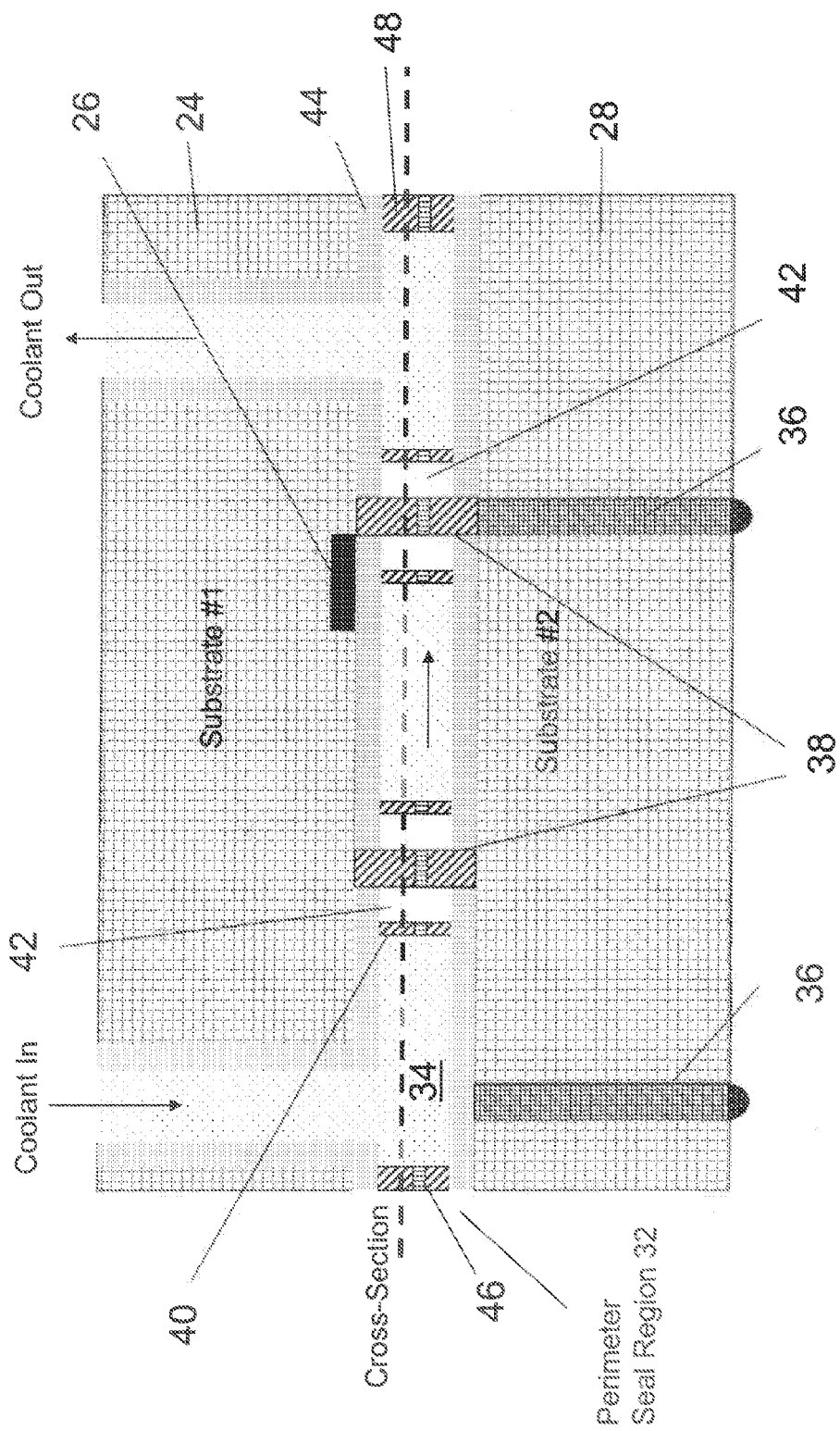

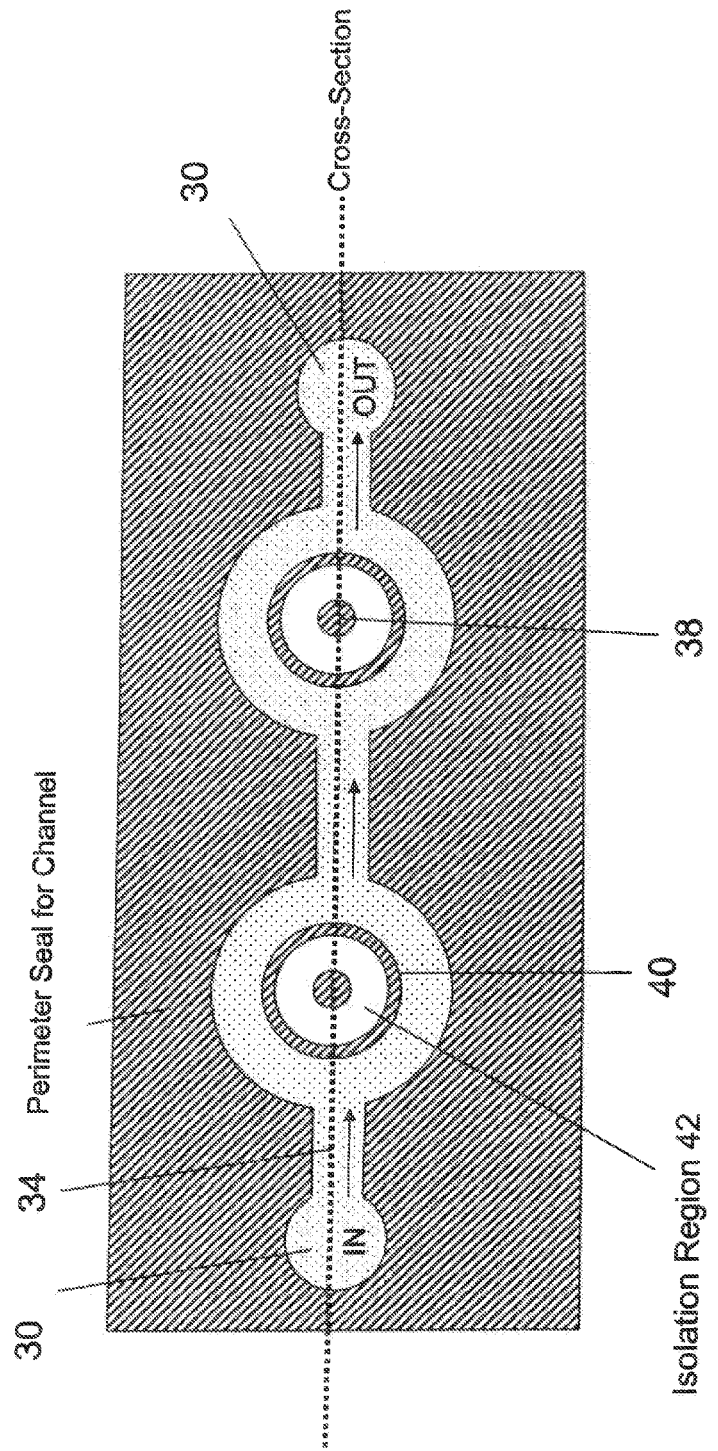

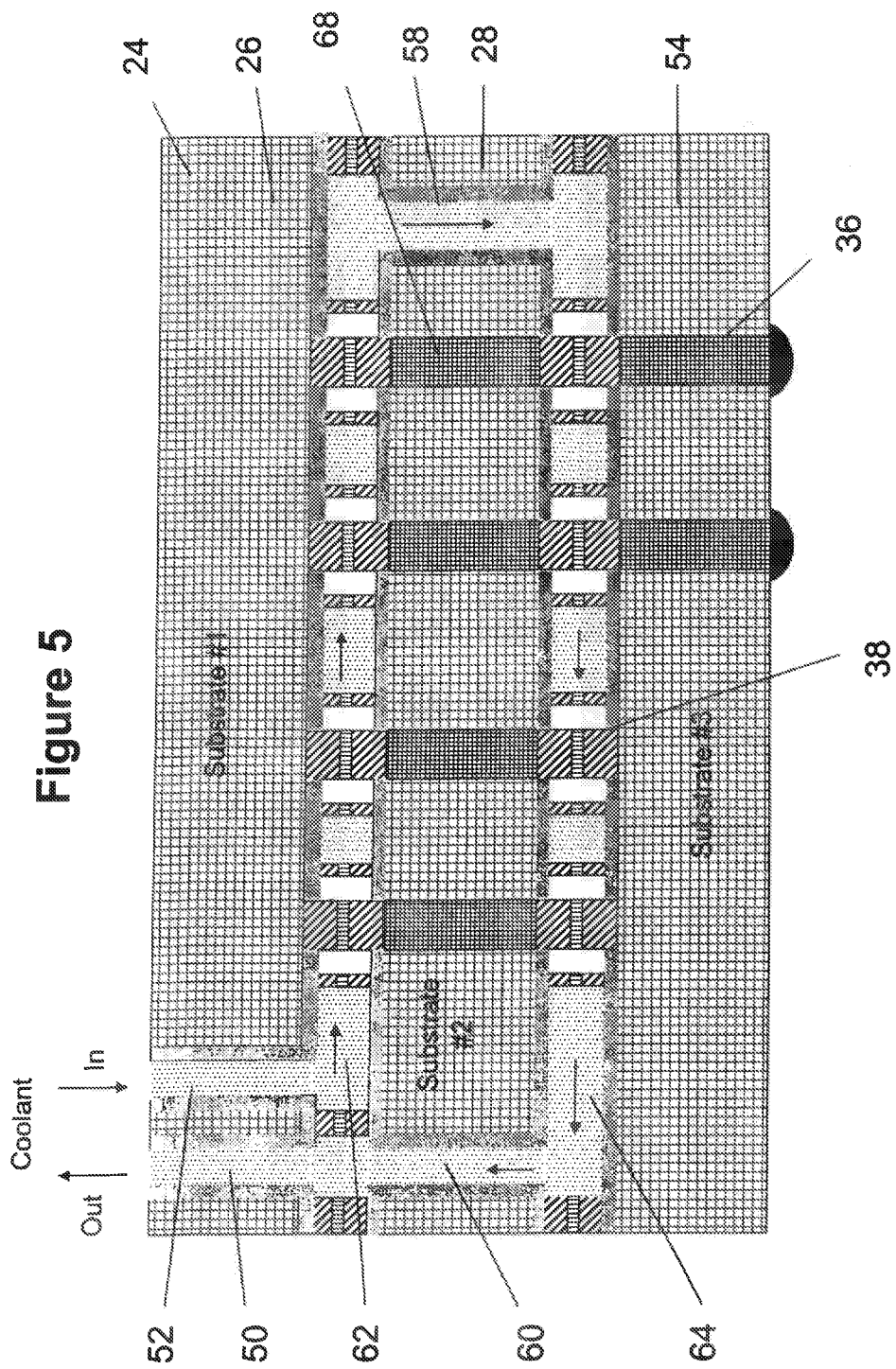

STRUCTURE AND PROCESS FOR ELECTRICAL INTERCONNECT AND THERMAL MANAGEMENT

DISCUSSION OF THE BACKGROUND

1. Field of the Invention

This invention relates to devices and methods for the management of thermal loads in stacked integrated circuits.

2. Background of the Invention

Interconnect delays are increasingly dominating IC performance due to increases in chip size and reduction in minimum feature size. The interconnect structures on chips are consuming more and more of the available power and delay budgets. Further, the global and semi global wires generally dominate the delay and power budgets of circuits.

An emerging architecture/technology attempting to alleviate these issues is three-dimensional (3D) integration. 3D integration represents a system level integration scheme in which multiple layers of integrated circuits (IC) are stacked and interconnected to each other in the stack or vertical direction. Thus, a large number of the long horizontal interconnects commonly used in two-dimensional (2D) structures are replaced by short vertical interconnects. The savings in area needed to interconnect a given set of chips and the shorter interconnect lines obtained by 3D are shown in FIG. 1. Accordingly, 3D results in smaller size of an electronic function and faster speeds and reduced power due to the shorter interconnect.

FIG. 1 shows on the left-hand side an arrangement of chip die 2, 4, 6 placed on a two-dimensional array and shows the connection distance along line AB between outer chip die. FIG. 1 shows on the right-hand side an arrangement of chip die 2, 4, 6 placed on a three-dimensional array and shows the connection distance along line AB between outer chip die.

Three-dimensional integration permits the integration of otherwise incompatible (or disparate) technologies, and offers significant advantages in performance, functionality, and form factor. Other technologies that could be conceivably included in the stack include antennae, sensors, power management and power storage devices. While semiconductor real estate is consumed by the vertical interconnect, the volume density of active/passive circuitry is dramatically increased, more than offsetting the real estate consumed.

One technique for building 3D IC's is based on IC stacking that utilizes wafer (or die) bonding, wafer/die thinning, and through-substrate interconnect formation. FIG. 2 shows an integrated circuit device several chip levels 10, 12, 14. Through-substrate interconnects are typically formed by first plasma etching a through-hole via, through the semiconductor from the front to back side or back to front side. This through-substrate via can be formed either before or after thinning, alignment and attach to form through-substrate via interconnects 16. After via formation, the vias are typically insulated and then filled usually with highly conductive material 18 (e.g., copper, tungsten, polysilicon, or aluminum) to form the through-substrate via interconnect 16.

In a "vias first" approach, vias are formed, followed by insulation of the sidewalls of the vias, and then filling the vias with a conductive material. After which, the substrate including the through-substrate via interconnect is typically thinned (e.g., by mechanical techniques) from the backside to expose a bottom for example of a copper filled via. Bonding pads 20 are formed on the exposed copper filled via for alignment to the next substrate, and commensurate substrates with matching bonding pads are joined, for example by eutectic bonding.

It is well know in the art that metallic systems can be used to form eutectic bonds. One example of such eutectic bonds is the Cu—Sn binary system (another being the Au—Sn binary system). In the Cu—Sn binary system a layer of tin is deposited (usually by plating) on one side of the two Cu interfaces (i.e., bonding pads) to be joined. Then, when placed together, heated and pressurized a Cu/Sn eutectic layer forms a strong bond and electrical connection from the contacts on one substrate to the connection points on the face of the other substrate. Other eutectics such as gold/tin can be used in a similar fashion. In another variation, polished copper surfaces can be placed together and heated to ca. 350° C. to form a fusion bond.

Numerous articles on the development of 3D integration have been reported such as the following reference articles all of which are incorporated herein by reference:

1. Davis et al., "Interconnect Limits on Gigascale Integration in the 21st' Century," Proceed of IEEE, Vol, 89, 2001, p. 305.
2. Banerjee et al., "3D ICs: A Novel Chip Design for Improving Deep Submicrometer Interconnect Performance and System-on-Chip Integration," Proceed. IEEE, Vol. 89, 2001, p. 602.
3. Klumpp et al., "Chip to Wafer Stacking Technology for 3D Integration," Proceed. IEEE Elect. Component Tech Conf, 2003, p. 1080.
4. Koo et al., "Integrated Microchannel cooling for 3D Electronic Circuit Architectures," J, Heat Transfer, V. 127, 2005, p. 49.
5. Tomita et al., "Copper bump bonding with electroless Metal Cap on 3D stacked structures," Electronics Packaging Technology Conf., 2000, p. 286.
6. Tomita et. al., "Copper Bump Interconnections in 20 um pitch utilizing electroless Tin-cap on 3D stacked LSI," 2000 Int. Symp. On Electronic Materials & Packaging, 2000, p. 107.
7. C. A. Bower, D. Malta, D. Temple, J. E. Robinson, P. R. Coffinan, M. R. Skokan and T. B. Welch, "High Density Vertical Interconnects for 3-D Integration of Silicon Integrated Circuits," Proc. IEEE ECTC, San Diego, Calif. 2006.
8. Sheiring et al., "Flip-Chip to wafer Stacking: Enabling Technology for Volume Production of 3D System Integration on Wafer Level," Proceed. European Microelectronic Packaging Conf., 2005, Brugge BE, p. 107.
9. Tan, et al., "3D Silicon Multi-Layer Stacking", 3D Architectures for Semiconductor Integration & Packaging," Phoenix, June 2005.

The advance of processing techniques to integrate circuits into 3D structures has, however, been limited in practice due to the increasingly higher chip heat load and the concomitant package heat dissipation requirement needed in order for the circuits in the integration to properly function.

SUMMARY OF THE INVENTION

In one embodiment of the present invention, there is provided a structure for thermal management of integrated circuits. The structure for thermal management of integrated circuits includes first and second substrates bonded together, at least one of the first and second substrates including at least one circuit element, an entrance through-hole having a length extending through a thickness of at least one of the first substrate and the second substrate, an exit through-hole having a length extending through a thickness of at least one of the first substrate and the second substrate, a bonding element forming a seal between the first and second substrates and forming a space between the first and second substrate, and a coolant channel formed in the space between the first and second substrates such that a fluid entering the entrance through-hole transits the coolant channel and the exit through-hole to provide cooling to the circuit element.

In one embodiment of the present invention, there is provided a method for making a structure for thermal management of integrated circuits. The method includes providing a first substrate and a second substrate, wherein at least one of the first and second substrates includes a circuit element, forming in at least one of the first substrate and the second substrate an entrance through-hole extending through a thickness of the first or second substrate, forming in at least one of the first substrate and the second substrate an exit through-hole extending through a thickness of the first or second substrate, forming respective bonding elements on at least one of the first and second substrates, and bonding the first and second substrates at the respective bonding elements to form a seal between the first and second substrates and to form a first coolant channel in between the first and second substrates.

In one embodiment of the present invention, there is provided a system for thermal management of first and second substrates in which at least one of the first and second substrates includes a circuit element. The system includes a fluid supply configured to supply a fluid through an entrance through-hole in at least one of the first and second substrates and to remove the fluid through an exit through-hole in at least one of the first and second substrates. The fluid in the system flows through a coolant channel between the first substrate and second substrates which is sealed by at least one bonding element joining the first substrate to the second substrate. The system includes a heat dissipater configured to dissipate heat accumulated in the fluid before return to the entrance through-hole.

In one embodiment of the present invention, there is provided a method for thermal management of integrated circuits. The method includes supplying a fluid through an entrance through hole in at least one of the first and second substrates, flowing the fluid through a coolant channel between the first substrate and second substrates in which the first coolant channel is sealed by at least one bonding element joining the first substrate to the second substrate, and removing the fluid from the coolant channel through an exit through-hole in at least one of the first and second substrates.

It is to be understood that both the foregoing general description of the invention and the following detailed description are exemplary, but are not restrictive of the invention.

BRIEF DESCRIPTION OF THE DRAWINGS

A more complete appreciation of the present invention and many attendant advantages thereof will be readily obtained as the same becomes better understood by reference to the following detailed description when considered in connection with the accompanying drawings, wherein:

FIGS. 3A-3B are schematic illustrations of a structure for thermal management according to one embodiment of the present invention;

FIG. 3C is a key for identification of the elements shown in FIGS. 3A-3B;

FIG. 4 is a cross sectional schematic illustration of the structure shown in FIGS. 3A-3B;

FIG. 5 is a cross sectional schematic illustration of a structure for thermal management according to one embodiment of the present invention;

DETAILED DESCRIPTION OF THE INVENTION

Figure 1:
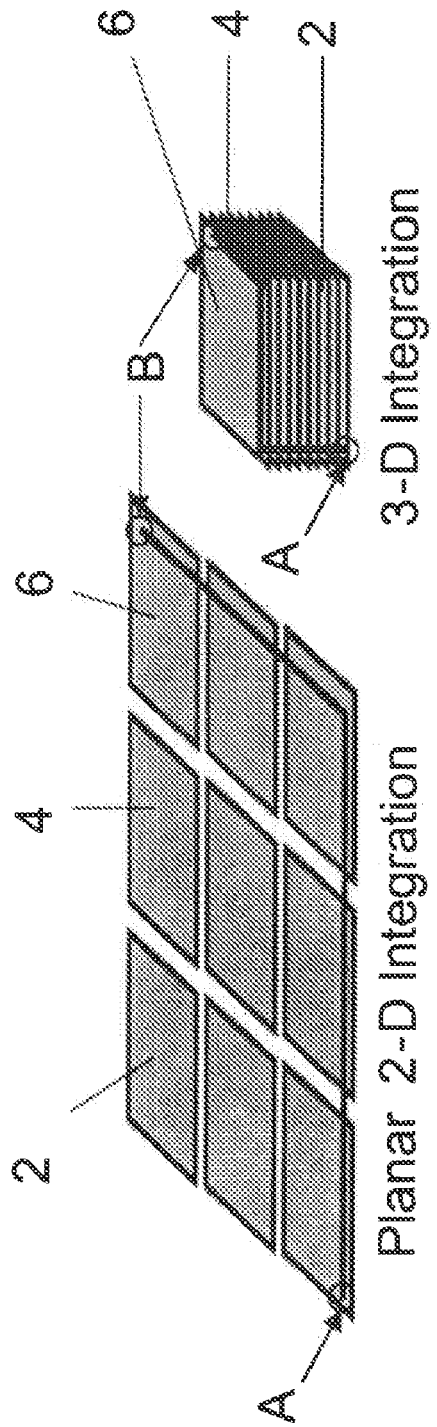
FIG. 1 is a schematic illustration of a conventional two-dimensional chip interconnect arrangement in comparison to a three-dimensional stacked chip arrangement.

The problem of extracting heat from an integrated circuit (IC) can be a significant problem, especially as the circuit density (and the waste heat dissipation) for chip sets are increasing. This problem is expected to be significantly more severe in 3D integrated circuits where the volumetric density of active and passive devices is dramatically increased and/or the thermal path length from an active device to the surface can be considerably longer. The problem is apparent in IC production past the 65 nm node in addition to current high performance devices at older IC production nodes, higher power analog/mixed signal ICs, IR focal plane arrays, or any structure that has required liquid or air cooling directly behind a functional or non-functional substrate.

More specifically, 3D circuits pose thermal management challenges due to the increase in total power generated per available surface area for cooling. In addition, the power generated per unit volume within the 3D circuit can vary significantly. For example, logic devices can generate significant quantities of heat as compared to memory devices. A majority of the heat generated in an integrated circuit is due to transistor switching and transistor leakage currents and interconnect losses (i.e., logic devices).

Heat from these heat sources is usually conducted to surface of the wafer, to the package and then to the ambient through a heat sink. However, as IC layers are stacked in 3D integration, the distance from the heat sources in one of the interior layers to the surface of the stack where the heat can be removed to the package and then to the ambient is greatly increased, increasing the thermal resistance between the transistor and the ambient, and limiting heat flow from the transistor. This problem is also exacerbated by the fact that in a 3D structure the intervening substrates may also contain active transistors producing additional heat that must also be transported to the ambient.

As discussed above, one technique for building a 3D IC structure is based on wafer to wafer, die to wafer, or die to die bonding, through-substrate interconnect formation, and wafer or die thinning. The through-substrate interconnects are created in the chips by either front end of line (FEOL) or back end of line (BEOL) processing. The present invention recognizes that conductive cooling channels can be created and interconnected in these and other processes for production of 3D IC structures with a minimum of additional processing. The following describes FEOL and BEOL processing terms in order to define terms for describing the present invention consistent with the art terminology in 3D IC structure fabrication.

In FEOL processing, dynamic random access DRAM (or embedded DRAM) technology is used to create tungsten, copper, or conductive polysilicon blind vias in the silicon before, or immediately after, the transistors are created and before any of the planar metal interconnects layers are created. Such commercial technology can be used in IC fabrication to create vias of appropriate diameter in the silicon and connect these vias, using normal on die interconnect to the top layer of pads. The bottoms of these vias are exposed later during wafer thinning and polishing. Via filling includes lining of the deep vias with an inorganic or organic insulator, deposition of a diffusion adhesion layer and subsequent metallization with Cu or W, or deposition of a conductive polysilicon without the diffusion/adhesion layer.

In BEOL processing, the through-substrate interconnects can be formed either before or after thinning, alignment and attachment. In BEOL vias first technology, vias are plasma etched to the correct depth in specific locations. These vias are then insulated and filled with conductor as described above. The substrates are then attached to a handling substrate, and thinned from the backside until the bottoms of the metallic vias are exposed. One method of attachment to the next substrate is to form conductive pads at via bottoms by sputtering a seed layer, plating and etching copper.

In BEOL vias last technology, the through-substrate interconnects are created in the thinned substrate after the bonding and thinning process. Only one of the substrates is thinned. The bonding and thinning processes may be performed in either order, bonding before thinning or thinning before bonding. Additionally, the substrates may be bonded face-to-face or face-to-back. In the face-to-face configuration, the through-layer interconnect typically connects the face side of the thinned substrate to a pad on the backside of the thinned substrate through the bulk (body) of the thinned substrate. In the face-to-back configuration, the through-substrate interconnect typically connects the face side of the thinned substrate to the face side of the unthinned substrate through both the bulk (body) of the thinned substrate and the bonding and insulating layers between the two substrates.

One of the connection technologies applicable to present invention is a copper tin eutectic bonding technology. In this technology, a layer of tin is deposited (usually by plating) on one side of the two Cu interfaces (i.e., bonding pads) to be joined. Then, when placed together, heated and pressurized a Cu/Sn eutectic layer forms a strong bond and electrical connection from the through-substrate interconnect on one substrate to the connection points on the face of the other substrate. Other eutectics such as gold/tin can be used in a similar fashion. In another variation, polished copper surfaces can be placed together and heated to ca. 350° C. to form a fusion bond.

Referring now to the drawings, wherein like reference numerals designate identical, or corresponding, parts throughout the several views, and more particularly to FIGS. 3A-3C thereof. FIGS. 3A and 3B depict schematics of structures for thermal management of integrated circuits according to the present invention. The structure 22 for thermal management of integrated circuits includes in general terms a first substrate 24 (e.g., the top substrate shown in FIG. 3A) which may contain at least one circuit element 26 acting as a heat source. The placement of the circuit element 26 is purely exemplary. There may be many circuit elements distributed across substrate 24 or in a second substrate 28 (e.g., the bottom substrate shown in FIG. 3A). Second substrate 28 can be considered to provide support for the first substrate 24 or vice versa. Substrate 28 may also contain circuit elements. In the embodiment shown in FIG. 3A, at least one coolant channel through-hole 30 is formed in both substrate 24 and 28 and extends through a thickness of substrate 24 and 28. A metallic bonding element 32 forms a seal between the first and second substrates and forms a space (as shown) between the first and second substrates 24 and 28. A coolant channel 34 formed in the space between the first and second substrates 24 and 28 such that a fluid entering the coolant channel through-hole 30 in substrate 24 transits the first coolant channel 34 to provide cooling to at least substrate 24.

FIGS. 3A and 3B shows through substrate interconnects 38 which electrically connect circuit elements (including for example logic and memory devices) on substrate 24 to wiring patterns and/or other devices on second substrate 28.

The present invention leverages presently available FEOL and BEOL processing and the bonding technologies described above to form this structure in which coolant channel through-holes 30 interconnect substrates for transferring heat much like through substrate interconnects 38 electrically interconnect different substrates in a substrate stack. In one embodiment of the present invention, as shown in FIG. 3B, cooling channels are formed in the space formed between substrates of the substrate stack by the eutectic bonding pads without the necessity of patterning channel through-holes on respective ones of the substrates. A cooling fluid supplied to the integrated wafer stack flows through vias and channels to the regions of the stack where heat generation, such as from fast logic devices or other high power circuits (e.g., high frequency analog amplifiers, power amplifiers, CPUs) exist.

Although the following description is described in terms of liquid cooling, the present invention is not limited to liquid cooling and the same concepts described below for liquid cooling will perform for similarly air cooled structures using forced air to carry the heat to the ambient. Substrates 24 and 28 may be a semiconductor, such as Si or GaAs, a ceramic, or a glass, where each substrate may have one or more electrical circuit elements. One of the substrates 24 and 28 can be a panel of thin film transistors as might be used in a TFT display or can be a ceramic or glass panel with thin film resistor, capacitor, and inductors as might be used for integrated passives.

FIG. 4 is cross sectional view showing a section detailing the coolant through holes 30, the coolant channel 34, and electrical interconnects 38 in FIGS. 3A and 3B. In this embodiment of the present invention, coolant (i.e., a fluid) enters by the left-hand side through hole 30 and travels in a channel 34 that follows around a circumference of isolation rings 40 on the electrical interconnect 38, before exiting by way of the right-hand side through hole 30. As detailed in FIG. 4, the electrical interconnect 38 is surrounded by the isolation ring 40. The isolation ring 40 includes a center electrical lead for the electrical interconnect 38 surrounded by a non-conductive region 42 (filled for example with a dielectric or filled with a non-conducting gas medium). The isolation ring 40 serves to form an interior wall of the coolant channel 34 and to enclose the non-conductive region 42. The isolation ring 40 (as shown in FIGS. 3A and 3B) in one embodiment is attached to an interior channel insulator 44 that was formed on each of the first and second substrates as shown in FIGS. 3A and 3B. The isolation ring 40 is formed by bonding reciprocal mating structures on the first and second substrates 24 and 28. The bonding plane 46 is depicted in FIGS. 3A and 3B, for clarity sake.

As shown in FIG. 3, metallic bonding elements 48 at the edges of the first and second substrates 24, 28 and also around the isolation rings 40 define a space separating the first and second substrates 24, 28. Typically, as described in the background, a eutectic film in position 46 joins the metallic bonding elements 48 between the first and second substrates 24, 28.

Besides providing thermal management for a two-substrate/wafer IC integration, the present invention is readily extendable to multi-substrate/wafer integrations. FIG. 5 is a schematic illustration of a three-substrate/wafer integration. In FIG. 5, two coolant through holes 50, 52 are formed in the first substrate 24 (e.g., the uppermost substrate). One of these coolant through holes 50 or 52 provides coolant supply, while the other through hole provides coolant return. (Alternatively, in one embodiment of the present invention, one coolant through hole could be in the first substrate, and another coolant through hole could be in the lowest substrate 54.)

The first substrate 24 in FIG. 5 is bonded to the middle or second substrate 28. Besides through-substrate interconnects 38, the second substrate 24 in this embodiment includes two coolant through holes 58, 60. As shown in FIG. 5, the right-side coolant through hole 58 supplies coolant to the region between the second substrate 28 and the lowest level substrate 54. The bonding regions between the first and second substrates 24, 28 form a first coolant channel 62 there in between. The bonding regions between the second and third substrates 28, 54 form a second coolant channel 64 there in between.

In one embodiment, electrical feed throughs 36 in the third substrate 54 connect to electrical feed throughs 68 in the second substrate 28 which connect to circuitry on the first substrate 24, which in this embodiment could include surface devices 26 on the coolant channel side of the first substrate 24. Alternatively, in another embodiment, the first substrate 24 could also have electrical feed throughs similar to second and third substrates 28, 54 which would electrically connect to the top surface of the first substrate 24. Regardless, according to one aspect of the present invention, alignment of the electrical feed throughs between the various substrates aligns the respective coolant through holes.

Figure 6:
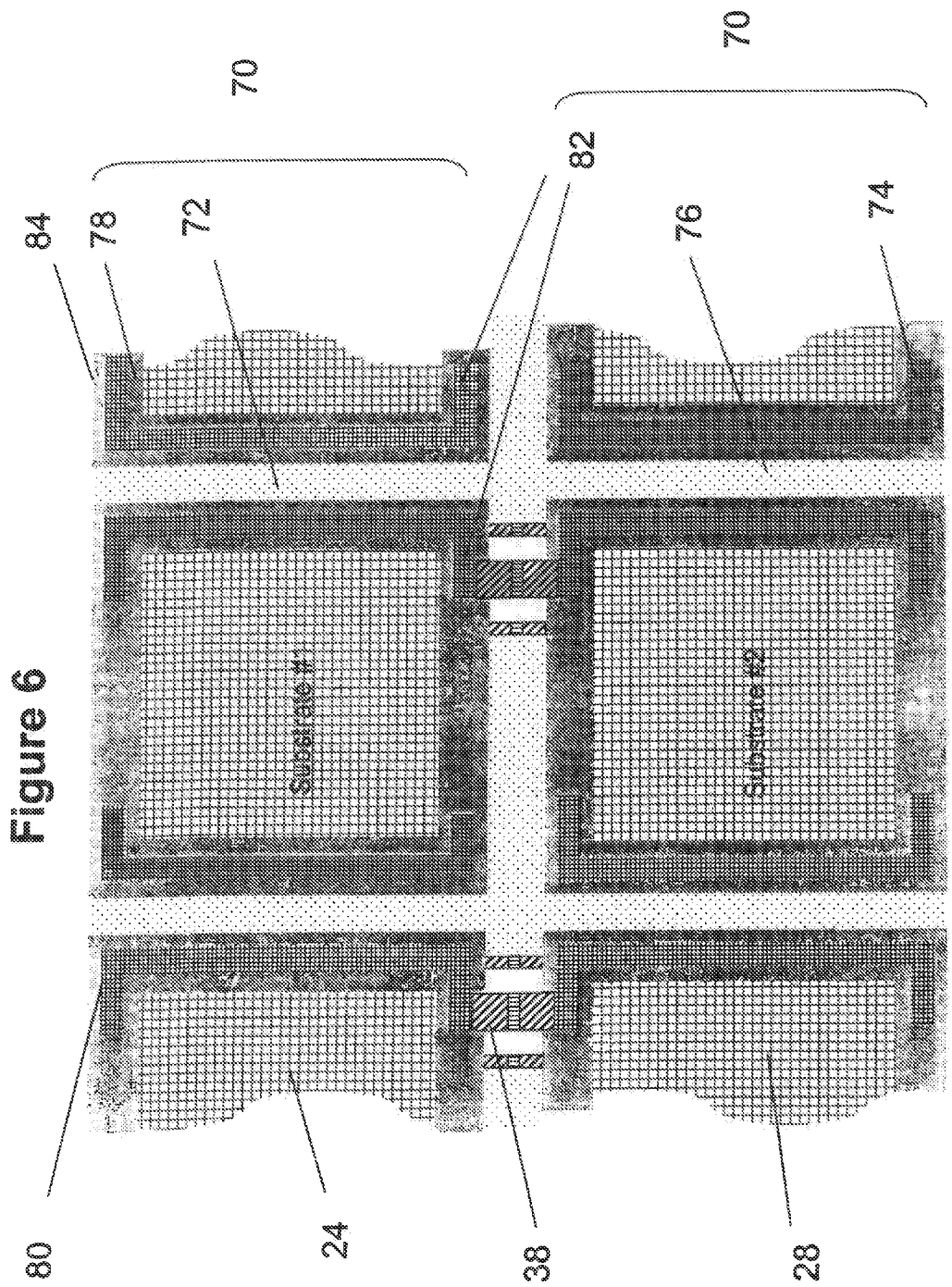
FIG. 6 is a cross sectional schematic illustration of a structure for thermal management according to one embodiment of the present invention.

FIG. 6 is a cross schematic illustration depicting an integrated coolant and electrical feed through 70 that can be used in the present invention. This configuration for the purposes of identification alone is referred to as a barrel via. In the barrel via 70, a center through hole channel 72 is hollow providing a channel for coolant flow through the depth of the first substrate 24. As shown in FIG. 6, a second, aligned barrel via 74 in the second substrate 28 provides a center through hole channel 76 for coolant flow through the second substrate 28.

In one embodiment of the present invention, the barrel via 70 is formed by forming a hole in the first substrate 24, providing a first layer 78 of electrical isolation, providing a conductive metal 80 with flanges 82 in the first layer 78 of electrical insulation, and then providing a second or exterior layer 84 of insulation over the conductive metal 80. Because the diameter of barrel via structure in this embodiment is greater than twice the thickness of the first and second layers of electrical insulation and the conductive metal, the through hole 72 for coolant flow exists.

As shown in FIG. 6, electrical interconnection between the first and second substrates 24, 28 is facilitated by metallic bonding elements connected to the flanges 82 of the barrel via 70. As before, the electrical interconnects 38 can have isolation rings, for example when a conducting coolant fluid is to be used.

Figure 7:
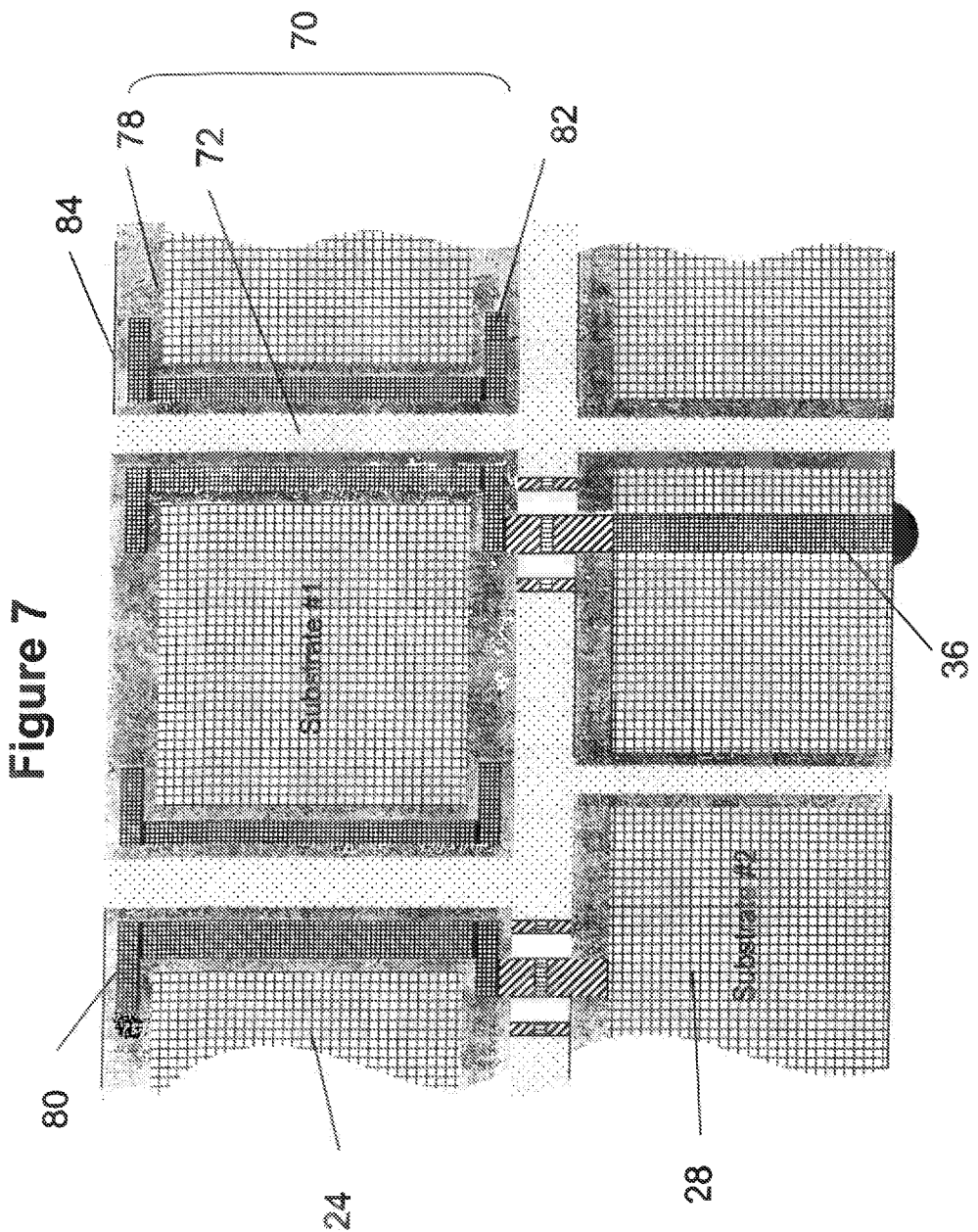
FIG. 7 is a cross sectional schematic illustration of a structure for thermal management according to one embodiment of the present invention.

FIG. 7 is a schematic illustration showing the integration of substrate 84 having a barrel via 70 to a second substrate 86 having the more traditional electrical feed through 36, as shown in FIG. 5. The elements in FIG. 7 are the same as those shown in FIGS. 5 and 6.

As follows from the discussion above, in one embodiment of the present invention, first and second substrates (e.g., substrates 24 and 28) bonded together. At least one of the first and second substrates includes at least one circuit element which acts as a heat generator. At least one through-hole having a length extending through a thickness of at least one of the first substrate and the second substrate is provided. On the substrates, a bonding element forms a seal (e.g., a perimeter seal 32) between the first and second substrates and forms a space between the first and second substrate for a coolant channel such that a fluid entering the at least one through-hole transits for example coolant channel 34 to provide cooling to the circuit element.

In one embodiment of the present invention, at least one through-hole (e.g., the barrel vias) is a metallic conduit connected to metallic bonding elements. In one embodiment of the present invention, the metal conduit is a flanged metal conduit having a flange region connected to at least one of the metallic bonding elements. In one embodiment of the present invention, a metallic interconnect extends through a thickness the first or second substrate and connects to the flange region. In order to permit electrically conductive coolants to be used, an electrical isolation film surrounds the metallic conduit. The electrical isolation film can be made of a $SiO_2$ layer, a $Si_3N_4$ layer, a $SiO_xN_y$ layer, a non-porous insulating layer, a polymeric layer, or a combination thereof.

In one embodiment of the present invention, the metallic bonding element includes a eutectic alloy joining the first and second substrate. Suitable eutectic alloys for the present invention include alloys having at least one of Cu, Sn, Au, and Pb. As discussed in the background and applicable to the present invention, eutectic bonds in the Cu—Sn binary system and the Au—Sn binary system can be used. In the Cu—Sn binary system a layer of tin is deposited (usually by plating) on one side of the two Cu interfaces (i.e., bonding pads) to be joined. Then, when placed together, heated and pressurized a Cu/Sn eutectic layer forms a strong bond and electrical connection from the contacts on one substrate to the connection points on the face of the other substrate. Other eutectics such as gold/tin can be used in the present invention in a similar fashion. In another variation, polished copper surfaces can be placed together and heated to ca. 350° C. to form a fusion bond in the present invention.

In one embodiment of the present invention, one or more metallic interconnects extends through a thickness of the first or second substrate. In this case, the metallic interconnect can be a part of an electrical connection to the circuit element of the first substrate. The metallic interconnect as described above can be a part of the through-hole extending through a width of the first or second substrate. In one embodiment, an electrical insulator separates the metallic interconnect from an interior of the through-hole. In one embodiment, an electrical insulator separates the metallic interconnect from the first and/or second substrate.

In one embodiment of the present invention, the coolant channel between the bonded substrates has a construction that makes for an undulating path for the fluid to flow between the first and second substrates. The shape of the coolant channel can make the undulating path a serpentine path or a spiral path such that the coolant is more uniformly distributed against the first substrate. In one embodiment of the present invention, two vertical passages are included through an upper substrate connecting to the coolant channel. One of the vertical passages can function as a coolant supply, while the other of the vertical passages can function as a coolant return.

Regardless of their function, the vertical passages can have a sidewall insulator disposed on respective interior surfaces of the vertical passages when a conducting fluid is to be used. The sidewall insulator can be a $SiO_2$ layer, a $Si_3N_4$ layer, a $SiO_xN_y$ layer, a non-porous insulating layer, a polymeric layer, or a combination thereof.

In one embodiment of the present invention, one or more of the bonded substrates includes wiring and device circuitry that like the first substrate can be cooled by fluid flow through the channel.

In one embodiment of the present invention, a third substrate (or other additional substrates) are included. The second or third substrates can also include wiring and device circuitry. The second substrate (if the third substrate is not included) or the third substrate can be a support substrate containing no active devices. A second coolant channel can be formed in a space between the second and third substrate such that a fluid entering the space between the second and third substrate transits the second coolant channel to provide cooling to the second and third substrates.

In one embodiment of the present invention, design of the coolant channels results in equilibration of a steady state temperature across the entire stack resulting in better performance due both to the lower operational temperature and a small variance in temperature across the entire circuit. The size of the cooling channels in both the horizontal and vertical (through-substrate) can be designed to deliver more cooling flow to areas of the circuits that generate the most heat.

The constraints on the size of the channels is dependent upon the number of electrical interconnects and mechanical robustness for the horizontal channels and the areal amount of the substrate that can be utilized for the vertical (through-substrate) channels. The dimensions of the through-substrate cooling vias are anticipated to in the 10s to 100s of microns. For the horizontal cooling channels, the dimensions are anticipated to be 2-20 microns in the vertical dimension and 10s to 100s of microns in the horizontal dimension.

In one embodiment of the present invention, one of the formed metallic bonding elements at the interconnecting interfaces between the first and second substrates is covered with a thin layer of a low temperature material that will form a eutectic with the primary metallic bonding material (e.g., tin on copper, copper being the primary metallic bonding material in his example) and the layers are joined to form both the electrical interconnection and the thermal management structure. In one embodiment of the present invention, the process of applying the copper and then for example tin to the faces requires a mask or other method of defining the location of the interconnecting interfaces. In one embodiment of the present invention, there are contact spots corresponding to each of the electrical vias used for electrical interconnection.

In one embodiment of the present invention, as copper is deposited and or plated and subsequently defined into metallic bonding pads at the interconnecting interfaces (i.e., the top and bottom surfaces of the device wafer), the bonding metal or other bonding material between the adjacent wafers forms a wall for the coolant channel between the first and second substrates.

In one embodiment of the present invention, the metallic bonding pads are solid metal-filled regions surrounding by a larger region where no metal is applied but with the remainder of that bonding surface covered by metal in which the coolant channel is formed. The larger region electrically isolates each connection point from the remainder to form the above-noted isolation rings.

In one embodiment of the present invention, the coolant channel can undulate or wind around a common axis as in a spiral design. In one embodiment of the present invention, the channel can be a serpentine channel. Other variations of the coolant conduction channels are possible according to the present invention.

In one embodiment of the present invention, the electrical vias can be coated with a metal (e.g., Cu or Al) to form conductive tubes. The conductive tubes can then be insulated with an insulator material and the remaining unfilled cross section of the conductive tube is used for liquid or air cooling of the devices.

Figure 8:
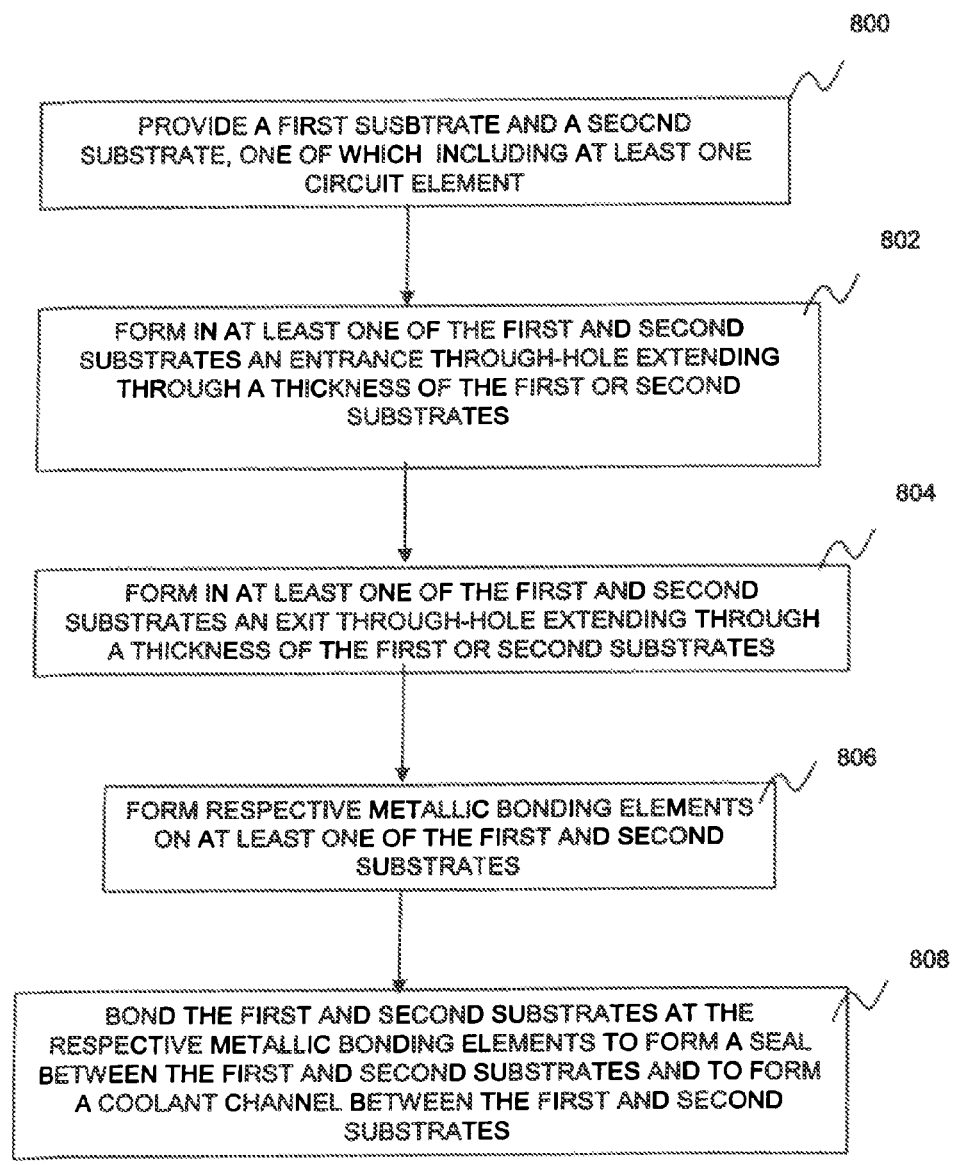
FIG. 8 is a flow chart showing one method according to the present invention for making a structure for thermal management of integrated circuits.

FIG. 8 is a flow chart showing one method according to the present invention for making a structure for thermal management of integrated circuits. At step 800, a first substrate and second substrate is provided, one of which including at least one circuit element. At step 802, an entrance through-hole is formed in at least one of the first and second substrate extending through a thickness of at least one of the first or second substrate. At step 804, an exit through-hole is formed in at least one of the first and second substrate extending through a thickness of at least one of the first or second substrate. At 806, respective metallic bonding elements are formed on at least one of the first and second substrates. At 808, the first and second substrates are bonded at the respective metallic bonding elements to form a seal between the first and second substrates and to form a first coolant channel in between the first and second substrates. The bonding forms a space between the first and second substrate for a coolant channel such that a fluid entering one of the at least one through-hole transits the coolant channel to provide cooling to at least the first substrate.

According to the present invention, as inter layer vias (i.e., the at least one through holes described above) are laid out in either the FEOL or BEOL processes described earlier, these inter layer vias are intentionally not filled for example with a copper conductor and serve as fluid flow channels from one level to the next. These level to level inter layer vias may be the same diameter as the electrical interconnect vias or may be larger depending on the liquid flow route and/or the liquid flow characteristics desired. (e.g. 5 µm). However, the present invention is not restricted to these diameters and smaller or large diameter vias may be used for the at least one through holes described above. As an example, vias from 1 to 100 µm or larger could be used.

While vias of a diameter less than 1 µm are within the scope of the present invention, these vias may present considerable resistance (especially to liquid fluid flow) and are not as desirable as larger vias. Similarly, while vias of a diameter larger than 100 µm are within the scope of the present invention, these vias may occupy too large of an area section of the chip for integrated circuit manufacturers to accommodate. Nonetheless, this disadvantage may not present in a problem in custom circuits such as applied specific integrated circuits (ASICs) or may not present in a problem in high power switching MOSFET device chips where the problems of chip survival justifies cooling vias occupying larger sections of the chip.

In one embodiment of the present invention, forming at least one through-hole at 804 can form a metallic conduit (e.g., a copper tube) connected to at least one of the metallic bonding elements. An electrical isolation film as shown in FIG. 6 can surround the metallic conduit. The formed metallic conduit can be a flanged metal conduit having a flange region connected to at least one of the metallic bonding elements. As shown in FIG. 6, the flange region upon bonding connects to the metallic interconnects extending through a width of the first and second substrates, and as such forms a part of an electrical connection to the circuit element, for example on the first substrate.

In one embodiment of the present invention, as shown in the barrel via of FIG. 6, the metallic interconnect can be a part of the through-hole extending through the thickness of the first or second substrate. An electrical insulator can be formed to isolate the metallic interconnect from an interior of the through-hole. An electrical insulator can be formed to isolate the metallic interconnect from at least one of the first and second substrate.

In one embodiment of the present invention, forming respective metallic bonding elements at 806 and bonding the first and second substrates at 808 forms for the channel an undulating path for fluid flow between the first and second substrates. FIG. 4 shows one such undulating path for fluid flow.

In one embodiment of the present invention, forming at least one through-hole at 804 forms two passages through at least one of the first and second substrates connecting to the channel. A sidewall insulator can be formed disposed on respective interior surfaces of the passages. In one embodiment of the present invention, a third substrate is provided (with at least one the second and third substrates includes wiring and device circuitry) and a second coolant channel is formed in a space between the second and third substrate to provide cooling to devices on either of the second or third substrates.

Figure 9:
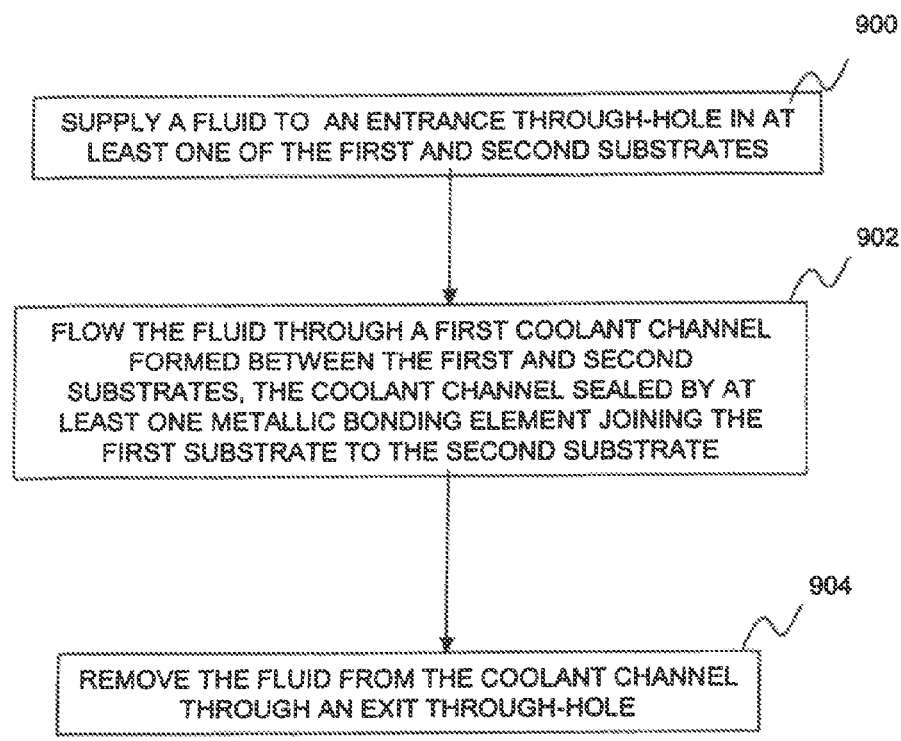
FIG. 9 is a flow chart showing one method according to the present invention for thermal management of integrated circuits.

FIG. 9 is a flow chart showing one method according to the present invention for thermal management of integrated circuits. At step 900, a fluid is supplied to an entrance through-hole in at least one of the first and second substrates. At step 902, the fluid is supplied in a coolant channel formed by a space between the first substrate and the second substrate, the coolant channel sealed by at least one metallic bonding element joining the first substrate to the second substrate. At 904, the fluid is removed from the coolant channel through an exit through-hole in at least one of the first and second substrates.

Heat accumulated in the fluid (for example while in contact with the first substrate) is dissipated before return to the coolant channel. Heat dissipation can occur for example by circulating the fluid through a heat exchanger before return to the coolant channel. Alternatively, the fluid can be dispensed into the ambient after fluid flow through the coolant channel and through the exit through-hole, as would be used for air cooling.

The coolant used for the present invention can be a gas or liquid supplied to the coolant channel. The coolant can include but is not limited to a hydrocarbon gas, a fluorinated hydrocarbon gas, a chlorinated hydrocarbon gas, helium, hydrogen, nitrogen, air, water, a hydrocarbon liquid, a fluorinated hydrocarbon liquid, a chlorinated hydrocarbon liquid, or liquid nitrogen. Further, in the present invention, the coolant can be supplied to a second coolant channel formed by a space between the second substrate and a third substrate, as shown fore example in FIG. 5.

Figure 10A:
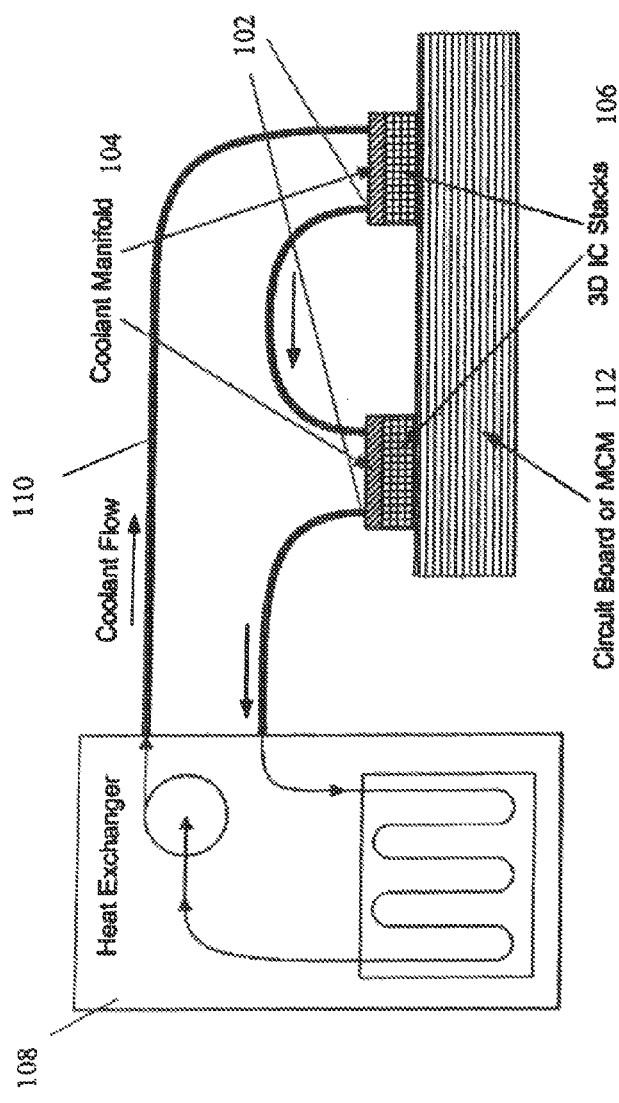
FIGS. 10a and 10b are schematic illustrations of systems according to the present invention for thermal management of integrated circuits.

In one embodiment of the present invention, as shown in FIG. 10A, inlets 100 and outlets 102 or the cooling fluid are provided on the IC stack 106. The IC stack can include the substrates and cooling channels shown in FIG. 3B or FIG. 5. The inlets and outlets 100 and 102 can be constructed in a number of non-restrictive ways, one of which would be gasketing inlet and outlet holes (plasma etched using the same technology as described) beneath the bottom die or having the gasketed inlet on the top die and the outlet on the bottom die (counter to the heat flows). The diameters of such holes can be in the 10s to 100s of microns. In one embodiment of the present invention, the inlet 100 can include an expansion valve such that expansion of a compressed fluid cools the IC stack 106.

Figure 10B:
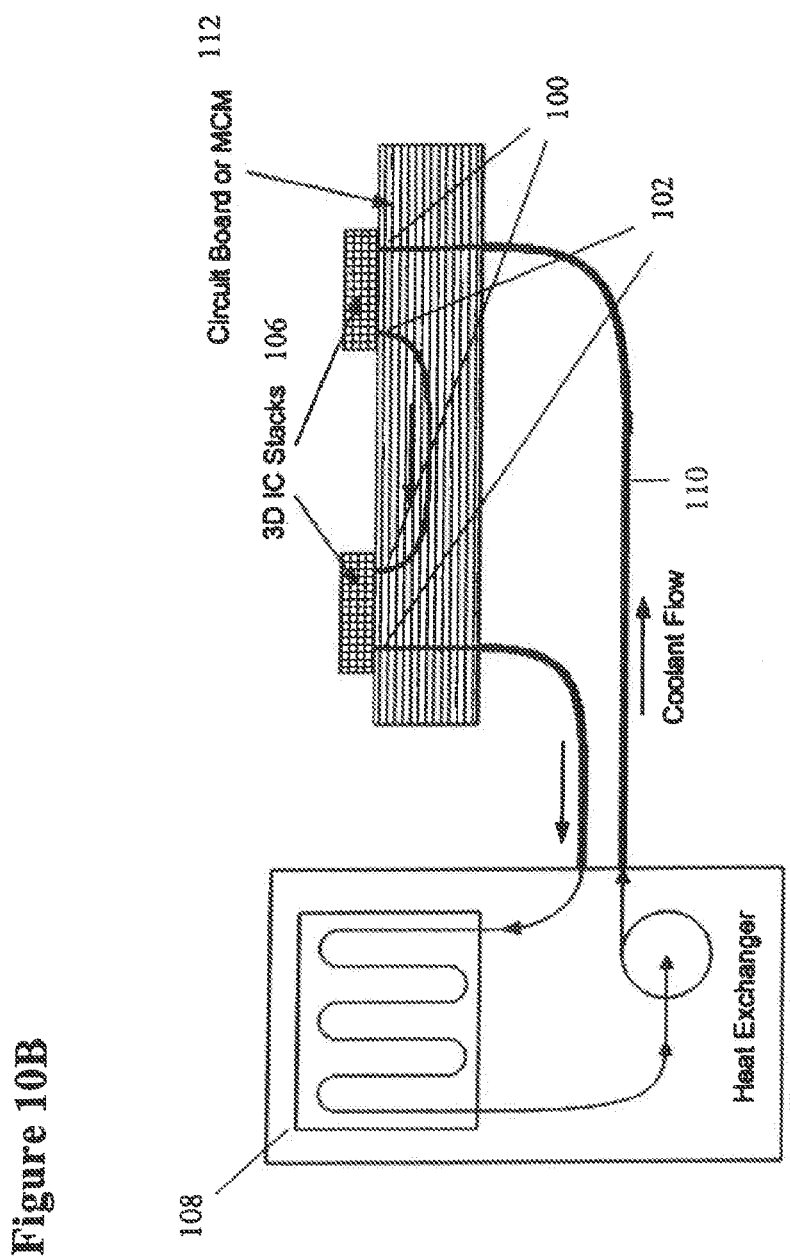

FIGS. 10A and 10B are schematic illustrations of systems according to the present invention for thermal management of integrated circuits. These systems include a heat exchanger 108, a pipe 110 to deliver to the fluid to one or more coolant manifolds 104 in the inlet 100 that attach to the thermally managed stacked IC 106. The stacked ICs can be attached to a larger circuit board 112 (or multi-chip module) which can also act as a coolant manifold, as shown in FIG. 10B. The system in 10A shows the IC stacks 106 being cooled sequentially without any involvement of the larger circuit board 112 (or multi-chip module). The pipe 110 can also be connected to the coolant manifolds 104 in parallel if sequential cooling is not desired. When the larger circuit board 112 (or multi-chip module) is also used as the coolant manifold, the internal channels in the circuit board (or multi-chip module) for the coolant may provide sequential cooling as shown in FIG. 10B or may be formed to provide parallel cooling.

Figure 2:
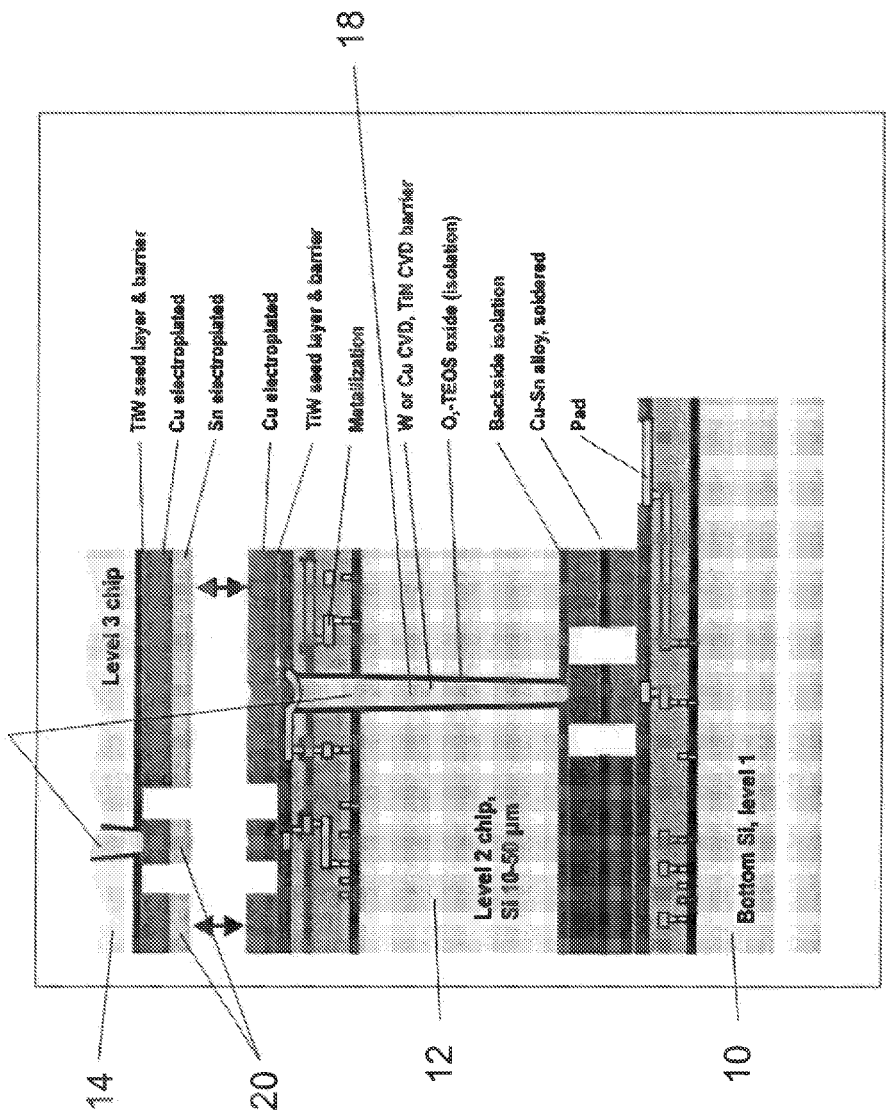
FIG. 2 is a schematic illustration of three-level integrated stacking using Cu—Sn—Cu eutectic bonding.
Figure 11:
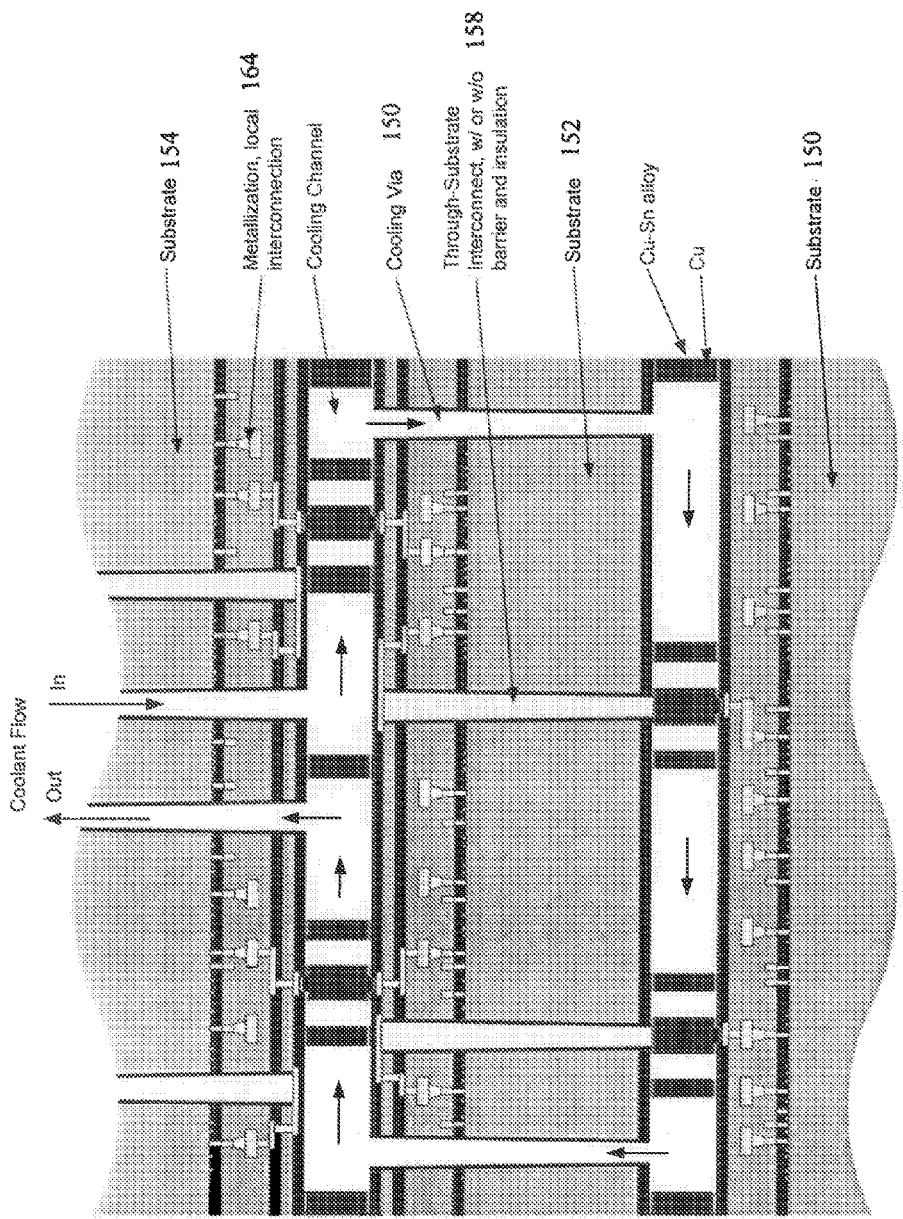
FIG. 11 is a schematic showing three-chip level as in FIG. 2, and having integrated therewith the thermal structures of the present invention.

FIG. 11 is a schematic of a multi-chip module showing three-chip level as in FIG. 2, and having integrated therewith the thermal structures of the present invention. FIG. 11 shows a three substrate configuration in which a base substrate 150 provides support for upper substrates 152 and 154. Vertical cooling channel through holes 156 exist in the upper substrates 152 and 154 and are integrated into the substrates along with electrical interconnects 158. Coolant channels 160 and 162 are formed between the substrates in this stack. As shown in this example, fluid entering the right-side top travels through the right-side of channel 160 and downward through the substrate 152 into coolant channel 162. The fluid returns through substrate 152 into the top left side of coolant channel 160 where the fluid is then expelled from the stack. FIG. 11 shows details of a number of metallization interconnects 164 connecting to devices (not shown) in this stack.

Numerous modifications and variations on the present invention are possible in light of the above teachings. It is, therefore, to be understood that within the scope of the accompanying claims, the invention may be practiced otherwise than as specifically described herein.

The invention claimed is:

1. A structure for thermal management, comprising:
   first and second substrates bonded together;
   at least one of the first and second substrates including at least one circuit element;
   an entrance through-hole having a length extending through a thickness of at least one of the first and second substrates;
   an exit through-hole having a length extending through a thickness of at least one of the first and second substrates;
   a first coolant channel formed in a space between the first and second substrates such that a fluid entering the entrance through-hole transits the first coolant channel and the exit through-hole to provide cooling to the circuit element;
   a bonding element forming a seal between the first and second substrates and having a thickness extending from a surface of at least one of the first and second substrates, and a space for the first coolant channel extending between the first and second substrates and separating the first and second substrates defined principally by said thickness of the bonding element.

2. The structure of claim 1, further comprising:
a metallic interconnect extending across the thickness of the first substrate or the second substrate and comprising an electrical connection to the circuit element.

3. The structure of claim 1, wherein the at least one circuit element comprises heat-generating circuits.

4. The structure of claim 1, wherein the bonding element comprises:
a eutectic alloy joining the first and second substrate.

5. The method of claim 4, wherein the eutectic alloy comprises:
an alloy including at least one of Cu, Sn, Au, and Pb.

6. The structure of claim 1, wherein the first coolant channel comprises an undulating path for fluid flow between the first and second substrates.

7. The structure of claim 6, wherein the undulating path comprises at least one of a serpentine path and a spiral path.

8. The structure of claim 1, further comprising a third substrate, and
wherein at least one the first, second, and third substrates includes heat-generating circuits.

9. The structure of claim 8, further comprising:
a second coolant channel formed in a space between the second and third substrates such that the second coolant channel provides cooling to the second and third substrates.

10. The structure of claim 1, wherein at least one of the entrance through-hole and the exit through-hole comprises:
two passages through the first substrate or through the second substrate, said passages connecting to the first coolant channel.

11. The structure of claim 10, wherein at least one of the two passages has an interior insulator disposed on interior surfaces of the passages.

12. The structure of claim 11, wherein the interior insulator comprises:
an air region, an inert gas region, a $SiO_2$ layer, a $Si_3N_4$ layer, a $SiO_xN_y$, a non-porous insulating layer, a polymeric layer, or any combination thereof.

13. The structure of claim 1, wherein at least one of the entrance through-hole and the exit through-hole comprises:
a metallic conduit extending across the thickness of the first substrate or the second substrate.

14. The structure of claim 13, wherein the metallic conduit comprises a metallic interconnect extending across the thickness of the first substrate or the second substrate and comprising an electrical connection to the circuit element.

15. The structure of claim 13, further comprising:
an electrical isolation region surrounding the metallic conduit.

16. The structure of claim 15, wherein the electrical isolation region comprises:
an air region, an inert gas region, a $SiO_2$ layer, a $Si_3N_4$ layer, a $SiO_xN_y$ layer, a non-porous insulating layer, a polymeric layer, or any combination thereof.

17. The structure of claim 13, wherein the metal conduit comprises a flange.

18. The structure of claim 17, further comprising:
a metallic interconnect extending through the thickness of the first substrate or the second substrate and connected to the flange.

19. The structure of claim 18, further comprising:
an electrical insulator isolating the metallic interconnect from an interior of the entrance through-hole or the exit through-hole.

20. The structure of claim 19, wherein the electrical insulator comprises:
an air region, an inert gas region, a $SiO_2$ layer, a $Si_3N_4$ layer, a $SiO_xN_y$ layer, a non-porous insulating layer, a polymeric layer, or any combination thereof.

21. A structure for thermal management, comprising:
first and second substrates bonded together;
at least one of the first and second substrates including at least one circuit element;
an entrance through-hole having a length extending through a thickness of at least one of the first and second substrates;
an exit through-hole having a length extending through a thickness of at least one of the first and second substrates;
a first coolant channel provided between the first and second substrates such that a fluid entering the entrance through-hole transits the first coolant channel and the exit through-hole to provide cooling to the circuit element;
a bonding element forming a seal between the first and second substrates;
said first cooling channel having,
side surfaces completely bounded by the bonding element, and top and bottom surfaces completely bounded by the opposed first and second substrates.

22. The structure of claim 21, further comprising:
a metallic interconnect extending across the thickness of the first substrate or the second substrate and comprising an electrical connection to the circuit element.

23. The structure of claim 21, wherein the at least one circuit element comprises heat-generating circuits.

24. The structure of claim 21, wherein the bonding element comprises:
a eutectic alloy joining the first and second substrate.

25. The method of claim 24, wherein the eutectic alloy comprises:
an alloy including at least one of Cu, Sn, Au, and Pb.

26. The structure of claim 21, wherein the first coolant channel comprises an undulating path for fluid flow between the first and second substrates.

27. The structure of claim 26, wherein the undulating path comprises at least one of a serpentine path and a spiral path.

28. The structure of claim 21, further comprising a third substrate, and
wherein at least one the first, second, and third substrates includes heat-generating circuits.

29. The structure of claim 28, further comprising:
a second coolant channel formed in a space between the second and third substrates such that the second coolant channel provides cooling to the second and third substrates.

30. The structure of claim 21, wherein at least one of the entrance through-hole and the exit through-hole comprises:
two passages through the first substrate or through the second substrate, said passages connecting to the first coolant channel.

31. The structure of claim 30, wherein at least one of the two passages has an interior insulator disposed on interior surfaces of the passages.

32. The structure of claim 31, wherein the interior insulator comprises:
an air region, an inert gas region, a $SiO_2$ layer, a $Si_3N_4$ layer, a $SiO_xN_y$, a non-porous insulating layer, a polymeric layer, or any combination thereof.

33. The structure of claim 21, wherein at least one of the entrance through-hole and the exit through-hole comprises:
a metallic conduit extending across the thickness of the first substrate or the second substrate.

34. The structure of claim 33, wherein the metallic conduit comprises a metallic interconnect extending across the thickness of the first substrate or the second substrate and comprising an electrical connection to the circuit element.

35. The structure of claim 33, further comprising:
an electrical isolation region surrounding the metallic conduit.

36. The structure of claim 35, wherein the electrical isolation region comprises:
an air region, an inert gas region, a $SiO_2$ layer, a $Si_3N_4$ layer, a $SiO_xN_y$ layer, a non-porous insulating layer, a polymeric layer, or any combination thereof.

37. The structure of claim 33, wherein the metal conduit comprises a flange.

38. The structure of claim 37, further comprising:
a metallic interconnect extending through the thickness of the first substrate or the second substrate and connected to the flange.

39. The structure of claim 38, further comprising:
an electrical insulator isolating the metallic interconnect from an interior of the entrance through-hole or the exit through-hole.

40. The structure of claim 39, wherein the electrical insulator comprises:
an air region, an inert gas region, a $SiO_2$ layer, a $Si_3N_4$ layer, a $SiO_xN_y$ layer, a non-porous insulating layer, a polymeric layer, or any combination thereof.

* * * * *

UNITED STATES PATENT AND TRADEMARK OFFICE
CERTIFICATE OF CORRECTION

PATENT NO.         : 8,035,223 B2
APPLICATION NO.    : 11/846253
DATED              : October 11, 2011
INVENTOR(S)        : Philip Garrou et al.

It is certified that error appears in the above-identified patent and that said Letters Patent is hereby corrected as shown below:

Column 13, Line 44, change "a SiOxNy" to --a SiOxNy layer--.

Column 15, Line 4, change "a SiOxNy" to --a SiOxNy layer--.

Signed and Sealed this
Twenty-first Day of February, 2012

David J. Kappos
*Director of the United States Patent and Trademark Office*